United States Patent [19]

Argade et al.

[11] Patent Number: 4,806,801
[45] Date of Patent: Feb. 21, 1989

[54] TTL COMPATIBLE CMOS INPUT BUFFER HAVING A PREDETERMINED THRESHOLD VOLTAGE AND METHOD OF DESIGNING SAME

[75] Inventors: Pramod V. Argade, Allentown; Arupratan Gupta, Philadelphia, both of Pa.

[73] Assignee: American Telephone and Telegraph Company, AT&T Bell Laboratories, Murray Hill, N.J.

[21] Appl. No.: 90,270

[22] Filed: Aug. 27, 1987

[51] Int. Cl.[4] .......................................... H03K 19/094
[52] U.S. Cl. ..................... 307/475; 307/303; 307/362; 307/451
[58] Field of Search ............... 307/443, 448, 451, 475, 307/362, 264, 303

[56] References Cited

U.S. PATENT DOCUMENTS

| | | | |
|---|---|---|---|
| 4,032,795 | 6/1977 | Hale | 307/264 X |
| 4,258,272 | 3/1981 | Huang | 307/475 |
| 4,568,844 | 2/1986 | O'Connor | 307/475 |
| 4,593,212 | 6/1986 | Svager | 307/475 |
| 4,626,704 | 12/1986 | Takata et al. | 307/264 |
| 4,626,712 | 12/1986 | Ozawa | 307/475 |
| 4,717,847 | 1/1988 | Nolan | 307/475 |
| 4,736,123 | 4/1988 | Miyazawa et al. | 307/451 X |
| 4,740,713 | 4/1988 | Sakurai et al. | 307/451 X |

FOREIGN PATENT DOCUMENTS 58-64828  4/1983  Japan .

OTHER PUBLICATIONS

Harroun, "Alterable Level Converting Circuit", IBM T.D.B., vol. 22, No. 8B, Jan. 1980, pp. 3638–3640.
"CVS Load Circuit", IBM T.D.B., vol. 28, No. 6, Nov. 1985, pp. 2576–2577.

Primary Examiner—David Hudspeth
Attorney, Agent, or Firm—Scott W. McLellan

[57] ABSTRACT

A TTL to CMOS static input buffer, and method for making same, having a first transistor (32) of a first conductivity type, having a control terminal responsive to a TTL input signal, a first output terminal coupled to a first voltage supply (Vdd) and a second output terminal; a second transistor (31) of a second conductivity type, having a predetermined threshold voltage, a predetermined width-to-length ratio, a control terminal responsive to the TTL input signal, a first output terminal coupled to an output node and a second output terminal coupled to a second voltage supply; a third transistor (33) of the second conductivity type, having a predetermined threshold voltage, a predetermined width-to-length ratio, a control terminal coupled to an intermediate voltage source, a first output terminal coupled to the second terminal of the first transistor and a second output terminal coupled to the output node; and a CMOS inverter (35) having a predetermined threshold voltage Vb; wherein the static input buffer has a predetermined threshold voltage established by the threshold voltage of the CMOS inverter and the ratio of the width-to-length ratio of the third transistor to the width-to-length ratio of the second transistor, when the buffer is enabled by the voltage of the intermediate voltage source being substantially that of the first voltage supply.

9 Claims, 2 Drawing Sheets

TTL COMPATIBLE CMOS INPUT BUFFER HAVING A PREDETERMINED THRESHOLD VOLTAGE AND METHOD OF DESIGNING SAME

FIELD OF THE INVENTION

This invention relates generally to voltage translation input buffers, and more particularly, to logic input buffers for translating transistor-transistor logic (TTL) voltage levels to complementary-metal-oxide-semiconductor (CMOS) logic voltage levels.

BACKGROUND OF THE INVENTION

CMOS logic is the technology of choice in today's very large scale integration (VLSI) digital integrated circuits. The low power dissipation and circuit density of CMOS logic allows greater circuit complexity than is possible with competing technologies. However, the interface required between the CMOS logic in the integrated circuits and the "outside" world is a CMOS incompatible standard. At present, TTL logic levels are used as the standard. In CMOS a logical "0" is represented by a voltage less than half of the power supply voltage (typically <2.5 volts) while a logical "1" is represented by a voltage greater than half the power supply voltage (>2.5 volts.) TTL requires a logical "1" to be greater than 2 volts and a logical "0" to be less than 0.8 volts. A well known circuit which translates the TTL logic levels to CMOS is diagrammed in FIG. 1. The buffer 10 is a static (non-clocked) scaled inverter in which the size of the N-channel resistor 11 is five times the size of the P-channel transistor 12. The sizing (scaling) of the transistors establishes the threshold of the buffer 10 to be approximately 1.4 volts, or half-way between 2 and 0.8 volts, the worst-case TTL logic voltage levels. However, this design is sensitive to processing variations in manufacturing (mobility variation, device threshold voltage variation, gate oxide thickness variation, physical transistor size distortion, etc.), operating temperature and input supply voltage (Vdd) variations to the buffer 10. These variations cause the threshold voltage to deviate over an exemplary range of 1.1 to 1.8 volts. Further, it is understood that the P-channel transistor 12 is inherently slower than the N-channel transistor 11 by a factor of 2.5 to 3 due to the mobility difference between P and N type semiconductors. Scaling of the N-channel transistor 11 by a factor of five larger than the P-channel transistor 12 aggravates the speed difference between the transistors 11, 12 to, roughly, a factor of 15. This speed difference causes propagation delay skew where the delay through the buffer 10 for an input signal having a high-to-low transition is much longer than that for an input signal having a low-to-high transition.

Another TTL to CMOS input buffer is diagrammed in FIG. 2. Buffer 20 is a two stage static TTL to CMOS input buffer utilizing the same scaled inverter approach of FIG. 1 (transistors 21, 22) in a first stage 20a but with transistor 23 operating as a level shifter, shifting the threshold voltage of stage 20a downward. The second stage, inverter 24, buffers the output of stage 20a and co-operates with stage 20a to achieve the desired threshold voltage of the buffer 20. Since this design is substantially the same as the scaled inverter of FIG. 1, the problems of variation in threshold voltage with process, temperature and input supply voltage variations still occur.

SUMMARY OF THE INVENTION

It is therefore a primary object of this invention to provide a TTL to CMOS input buffer which has a substantially invariant threshold voltage with processing, temperature and supply voltage variations. Further, this input buffer has substantially equal propagation delay regardless of the transition polarity of a TTL logic level input signal. According to the present invention, the TTL to CMOS input buffer has a first transistor of a first conductivity type, having a control terminal responsive to the TTL input signal, a first output terminal coupled to a first supply voltage and a second output terminal coupled to a first node; a second transistor of a second conductivity type having a control terminal responsive to the TTL input signal, a first output terminal coupled to an output node and a second output terminal coupled to a second voltage supply; a CMOS inverter (35), responsive to the output node, for providing the CMOS logic output signal; and a third transistor (33) of a second conductivity type, having a control terminal coupled to an intermediate voltage source, a first output terminal coupled to the second terminal of the first transistor and a second output terminal coupled to an output node. The buffer is enabled when the voltage of the intermediate voltage source is substantially that of the first voltage supply. The ratio of the width-to-length ratios of the second and third transistors is chosen to establish the threshold voltage of the input buffer while minimizing the effects of processing, temperature and power supply variations on the threshold voltage. The characteristics of the first transistor has substantially little effect on the threshold voltage.

DETAILED DESCRIPTION

Figure 3:
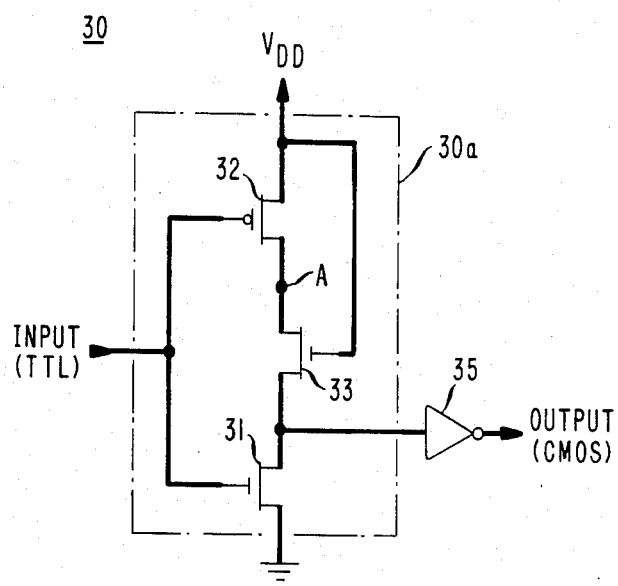
FIG. 3 is a schematic diagram of an input buffer according to the present invention.

Referring to FIG. 3, the TTL to CMOS input buffer 30 according to the present invention is diagrammed. The buffer 30 has two stages: a first stage 30a and an inverter 35 buffering the output of the stage 30a for driving CMOS logic devices (not shown.) The gate of N-channel transistor 31 couples to the input to which a TTL logic level input signal is applied. The source terminal of transistor 31 couples to ground and the drain thereof couples to the output of the stage 30a. A P-channel transistor 32 also has its gate coupled to the input of buffer 30, with the source coupled to an input voltage source, Vdd, the most positive supply voltage, typically five volts. The drain terminal of transistor 32 couples to the drain terminal of back-biased N-channel transistor 33 at node A. The gate of transistor 33 couples to Vdd and the source to the output of the stage 30a. Inverter 35, having a predetermined threshold voltage Vb, is preferably a scaled inverter of the design shown in FIG. 1, but it is understood that any suitable logic element having a predetermined threshold voltage may be used. A further purpose of inverter 35 is to insure a symmetrical propagation delay for high-to-low and low-to-high input signal transitions through the buffer 30. Any propagation distortion from the stage 30a is counteracted by a substantially equal propagation distortion from the inverter 35.

Figure 4:
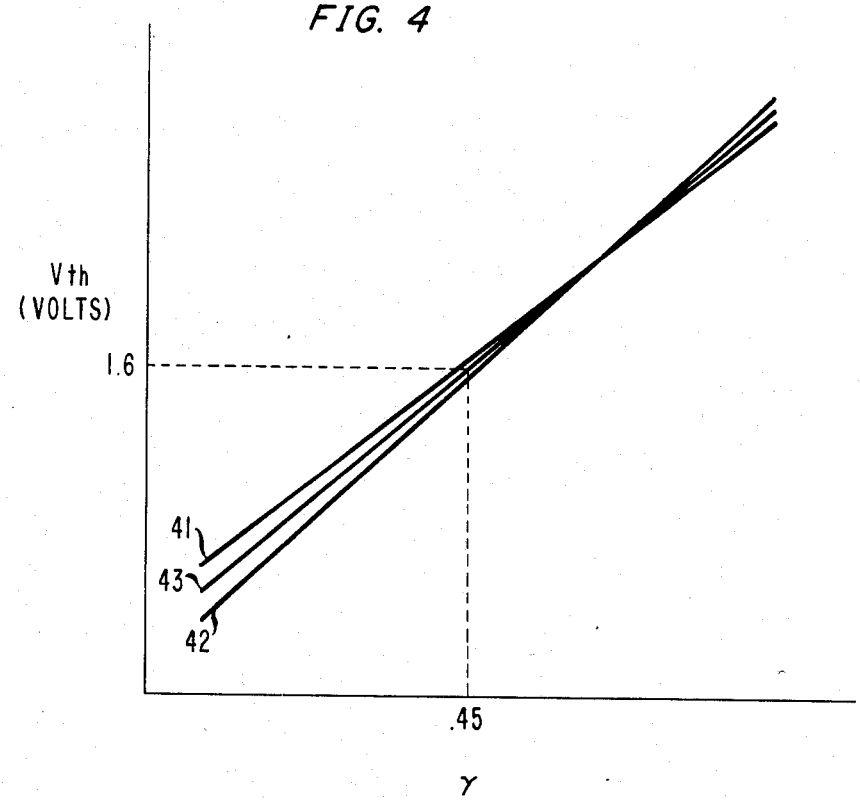
FIG. 4 is a plot of threshold voltage verses a scaling factor for the input buffer diagrammed in FIG. 3.

The buffer 30 is designed by first determining the desired threshold voltage Vth, the input voltage to stage 30a at which the output of inverter 35 changes state. As discussed above, the desired threshold voltage for TTL compatibility is 1.4 volts. However, other voltages within the range of 0.8 to 2.0 volts is satisfactory in worse-case conditions. The threshold voltage, Vth, of the buffer 30 is determined by:

$$Vth = \gamma(Vdd - VB - V33) + V31$$

where $\gamma$ is a scaling factor determined by:

$$\gamma^2 = \frac{W33/L33}{W31/L31}$$

and Vb is the threshold voltage of the CMOS inverter 35, V31 and V33 are the threshold voltages of transistors 31, 33, W31/L31 and W33/L33 are the width-to-length ratios of the gate regions of transistors 31, 33. It is noted that the threshold voltage Vth is independent of the mobility of the transistors 31, 32 and 33 and the threshold and physical dimensions of P-channel transistor 32. For purposes here, all transistors are assumed to be long-channel field-effect transistors, such that any short-channel effects are ignored. With typical threshold voltages for transistors 31-33, Vb and Vdd, $\gamma$ can be determined. FIG. 4 is a plot the threshold voltage Vth verses $\gamma$ for different processing variations. Curve 41 represents fast P-channel transistors (transistors having higher than normal mobility) and slow N-channel resistors (transistors having lower than normal mobility) while curve 42 represents fast N-channel transistors and slow P-channel transistors. Curve 41 and 42 represent the worst-case variations in processing while curve 43 represents the median processing values for both P and N devices. Typically, $\gamma$ ranges from approximately 0.2 to 0.6 for Vth between 1.0 and 2.0 volts. Upon choosing a suitable $\gamma$ for a particular Vth, the width-to-length ratios of transistors 31 and 33 are determined accordingly.

Figure 1:
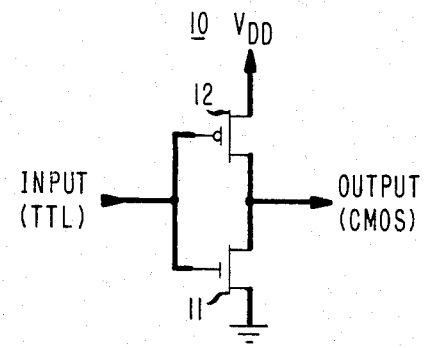
FIG. 1 is a schematic diagram of a static input buffer of the prior art.
Figure 2:
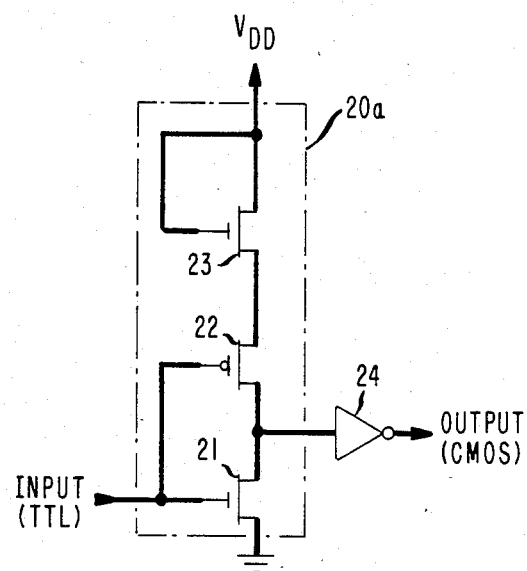
FIG. 2 is a schematic diagram of another input buffer of the prior art.

To insure proper operation of buffer 30, both transistors 31, 33 must be saturated when the input voltage of buffer 30 is Vth under worst-case conditions, i.e., both transistors 31, 33 are operating as current sources at the threshold voltage under the worst possible combination of temperature, power supply voltage and process variations. To insure saturation, the P-channel transistor 32 is sized to provide adequate current to maintain node A above a minimum potential, Va, such that transistors 31, 33 are saturated under the worst-case conditions. Generally, transistor 32 is designed to operate in the linear, or ohmic, transistor operating region when the input voltage of buffer 30 is Vth and is initially sized to be twice that of transistor 33. The buffer 30 is then modeled and the operation of transistors 31, 32 and 33 are checked under worse-case conditions with the input at Vth. Should the transistors 31 and 33 not be saturated, the size of transistor 32 is increased, the buffer 30 is remodeled and the process is repeated. Further, the model is checked for the amount of propagation skew through both the buffer 30 and the buffer 35. Should the propagation skew be unacceptable, the size of the P-channel transistor 32 can be changed so long as the size thereof is larger than the minimum size necessary for proper operation of transistors 31, 32 and 33, as described above. Further adjustments can be made by selecting another $\gamma$ or Vb that yields an acceptable threshold voltage Vth and the design process is repeated. A CMOS inverter 35, typically being of conventional design as shown in FIG. 1, produces an output voltage of Vdd/2 when the input thereto has a voltage Vb, where Vb is approximately Va/2. This assures maximum noise immunity and proper logic levels for driving CMOS logic circuitry (not shown.) It is noted that a CMOS gate can be substituted for the inverter 35 should a logic function be desired.

It is also noted that buffer 30 can be adapted to be a dynamic, or clocked, TTL to CMOS input buffer by decoupling the gate of transistor 33 from Vdd and coupling it to a control signal. When the control signal has a voltage substantially equal to Vdd, the buffer 30 operates as described above. However, should the control signal have a voltage substantially equal to ground or zero volts, the buffer 30 is disabled, reducing the power consumption of the buffer 30 to nearly zero.

An example of the input buffer 30 according to the present invention having a TTL compatible threshold and optimized for substantially zero propagation delay skew is described below. For a desired threshold voltage Vth of buffer 30 of 1.6 volts, with a Vdd of 5 volts, the inverter 35 threshold, Vb, set to 2.3 volts and typical threshold voltages V31 and V33 are set to 0.7 and 1.1 volts, respectively. From the plot in FIG. 4, $\gamma$ is determined to be approximately 0.45. Solving the equation for the width-to-length ratios of transistors 31, 33 with $\gamma = 0.45$, the width-to-length ratio for transistor 31 is approximately five times that of transistor 33. The channel lengths of transistors 31 and 33, L31 and L33, are set to the minimum length obtainable and the corresponding widths, W31 and W33, are determined accordingly. Therefore, one viable solution has the width-to-length ratios of transistors 31 and 33 to be 23:1 and 4:1, respectively. With such ratios, to maintain both transistors 31, 33 saturated with an input voltage of 1.6 volts and a substantially zero propagation skew, the size of the P-channel transistor 32 is initially set to 8:1. The input buffer is then modeled over the desired temperature, mobility (processing) and power supply variation ranges with the input to the buffer 30 set to Vth (here 1.6 volts), making sure transistors 31, 33 remain saturated. If not, the size of transistor 32 is changed and the input buffer 30 is re-evaluated. Further, the input buffer is tested for propagation delay skew for low-to-high and high-to-low TTL input signals. Should the skew be unacceptable, the size of the transistor 32 can be changed and the propagation skew retested, provided the transistors 31, 32 and 33 still operate as described above when the TTL input signal voltage is 1.6 volts. This results in the transistor 32 having a 12:1 width-to-length ratio for an input buffer 30 with a worst-case threshold variation of 35 millivolts, a standby current drain of less than one milliamperes, a propagation delay of 3.1 nanoseconds and no propagation delay skew.

Having described the preferred embodiment of this invention, it will now be apparent to one of skill in the art that other embodiments incoporating its concept may be used. It is felt, therefore, that this invention should not be limited to the disclosed embodiment, but rather should be limited only by the spirit and scope of the appended claims.

What is claimed is:

1. A TTL compatible CMOS input buffer in an integrated circuit for converting TTL input signals to CMOS logic output signals, having:
   a first transistor (32) of a first conductivity type, having a control terminal responsive to the TTL input signal, a first output terminal coupled to a first voltage supply (Vdd) and a second output terminal;
   a second transistor (31) of a second conductivity type, having a control terminal responsive to the TTL input signal, a first output terminal coupled to an output node and a second output terminal coupled to a second voltage supply, a predetermined threshold voltage (V31) and a predetermined channel width-to-length ratio (W31/L31); and,
   a CMOS logic stage (35), having an predetermined threshold voltage (Vb) and responsive to the output node, for providing the CMOS logic output signal;
   characterized by a third transistor (33) of a second conductivity type, having a control terminal coupled to control voltage source, a first output terminal coupled to the second terminal of the first transistor and a second output terminal coupled to the output node, a predetermined threshold voltage (V33) and a predetermined channel width-to-length ratio (W33/L33);
   wherein the input threshold voltage (Vth) of the input buffer is substantially determined by the equation:

$$Vth = \gamma(Vdd - Vb - V33) + V31$$

where $$\gamma^2 = \frac{W33/L33}{W31/L31}$$

2. The buffer recited in claim 1, wherein the width-to-length ratio of the first transistor is greater than twice the width-to-length ratio of the third transistor.

3. The buffer recited in claim 2, wherein the CMOS logic stage is a CMOS inverter.

4. The buffer recited in claim 3, wherein the second voltage supply has a voltage of substantially zero volts (ground.)

5. The buffer recited in claim 4, wherein the third transistor is a back-biased field-effect transistor.

6. The buffer recited in claim 5, wherein the buffer is enabled when the voltage of the control voltage source is substantially that of the first voltage supply and the buffer is disabled when the voltage of the intermediate voltage source is substantially that of the second voltage supply.

7. The buffer recited in claim 6, wherein the transistors of the first conductivity type are P-channel field-effect transistors and transistors of the second conductivity type are N-channel field-effect transistors.

8. Method for establishing a predetermined threshold voltage Vth of a TTL compatible CMOS input buffer for converting a TTL input signals, having high-to-low and low-to-high transitions, to CMOS logic output signals, having:
   a first transistor (32) of a first conductivity type, having a control terminal responsive to the TTL input signal, a first output terminal coupled to a first voltage supply (Vdd) and a second output terminal;
   a second transistor (31) of a second conductivity type, having a control terminal responsive to the TTL input signal, a first output terminal coupled to an output node and a second output terminal coupled to a second voltage supply, a predetermined threshold voltage (V31) and a predetermined channel width-to-length ratio (W31/L31);
   a third transistor (33) of a second conductivity type, having a control terminal coupled to the first voltage supply, a first output terminal coupled to the second terminal of the first transistor and a second output terminal coupled to the output node, a predetermined threshold voltage (V33) and a predetermined channel width-to-length ratio (W33/L33); and,
   a CMOS logic stage (35), having an initial threshold voltage (Vb) and responsive to the output node, for providing the CMOS logic output signal; comprising the steps of:
   A. determining $\gamma$ for the predetermined threshold Vth from:

$$Vth = \gamma(Vdd - Vb - V33) + V31;$$

B. determining the ratio of the sizes of the second and third transistors from:

$$\gamma^2 = \frac{W33/L33}{W31/L31}$$

C. defining the size of the third transistor;
   D. setting the size of the second transistor to satisfy the ratio defined in step B;
   E. setting the size of the first transistor to twice that of the third transistor; and,
   F. adjusting the size of the first transistor to insure saturation of the second and third transistors and linear operation of the first transistor when the voltage of the TTL input signal is Vth.

9. The method for establishing a predetermined threshold voltage for the TTL to CMOS input buffer recited in claim 8, further characterized by:
   G. adjusting the size of the first transistor to have symmetrical propagation delay through the buffer for the high-to-low and low-to-high input signal transitions;
   H. repeating steps F and G until simultaneously satisfied; and,
   I. adjusting Vth and Vb should steps F and G not be simultaneously satisfied and repeating steps A through I.

* * * * *